United States Patent [19]

Sugawara

[11] Patent Number: 4,559,457
[45] Date of Patent: Dec. 17, 1985

[54] SAMPLING CIRCUIT

[75] Inventor: Tsutomu Sugawara, Yokosuka, Japan

[73] Assignee: Tokyo Shibaura Denki Kabushiki Kaisha, Kawasaki, Japan

[21] Appl. No.: 504,311

[22] Filed: Jun. 14, 1983

[30] Foreign Application Priority Data

Jun. 28, 1982 [JP] Japan .................... 57-111216

[51] Int. Cl.$^4$ ............... H03K 17/60; G11C 27/02
[52] U.S. Cl. ............................ 307/352; 328/151; 307/359; 307/353
[58] Field of Search ............ 307/352, 353, 359; 328/151

[56] References Cited

U.S. PATENT DOCUMENTS 3,526,786  9/1970  Snyder ..................... 307/352
3,643,110  2/1972  Thompson ................. 307/353
3,694,668  9/1972  Foerster ................... 328/151

OTHER PUBLICATIONS

Data Acquisition Components and Subsystems Catalog, Analog Devices, Inc., 1980.

Primary Examiner—John Zazworsky
Attorney, Agent, or Firm—Oblon, Fisher, Spivak, McClelland & Maier

[57] ABSTRACT

A sampling circuit generally suitable for a sample-and-hold circuit is disclosed which includes two differential amplifiers selectively rendered operative during the sampling and nonsampling periods, respectively, an adder for receiving output signals from the differential amplifiers, and a switching bipolar transistor. One differential amplifier is rendered operative during the sampling period. The output signal from this differential amplifier is negatively fed-back through the adder and the switching bipolar transistor to the inverting input terminal thereof connected to an output terminal of the sampling circuit. However, during the nonsampling interval, the other differential amplifier is rendered operative. The output signal from this differential amplifier is fed-back to the inverting input terminal thereof through the adder. Therefore, the switching bipolar transistor is rendered nonconductive, and the analog signal supplied to an input terminal of the sampling circuit is prevented from being transferred to the output terminal of the sampling circuit.

7 Claims, 11 Drawing Figures

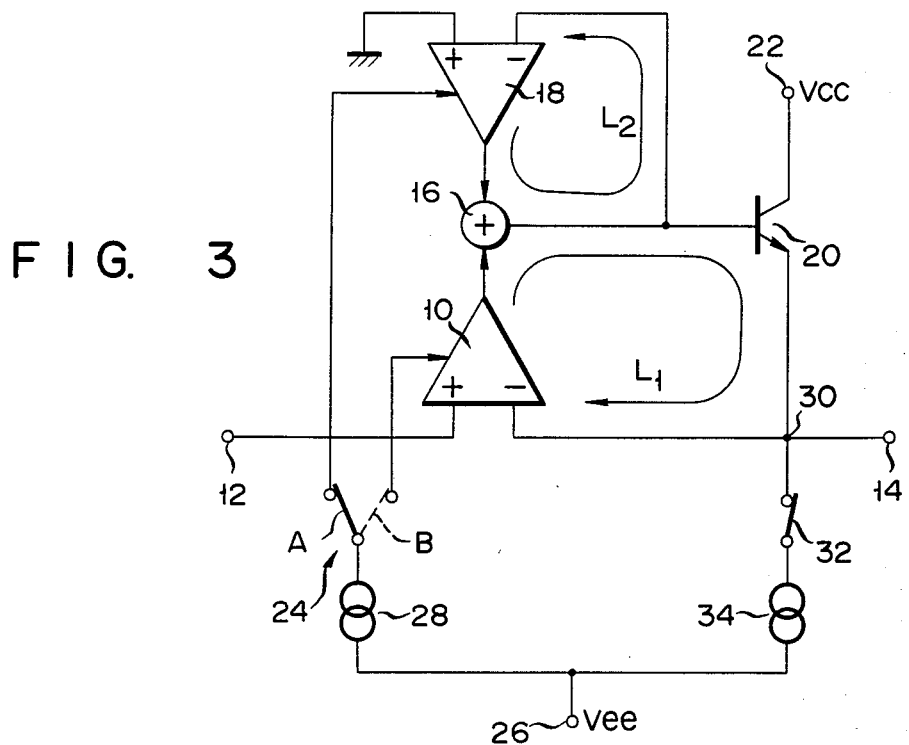
FIG. 3
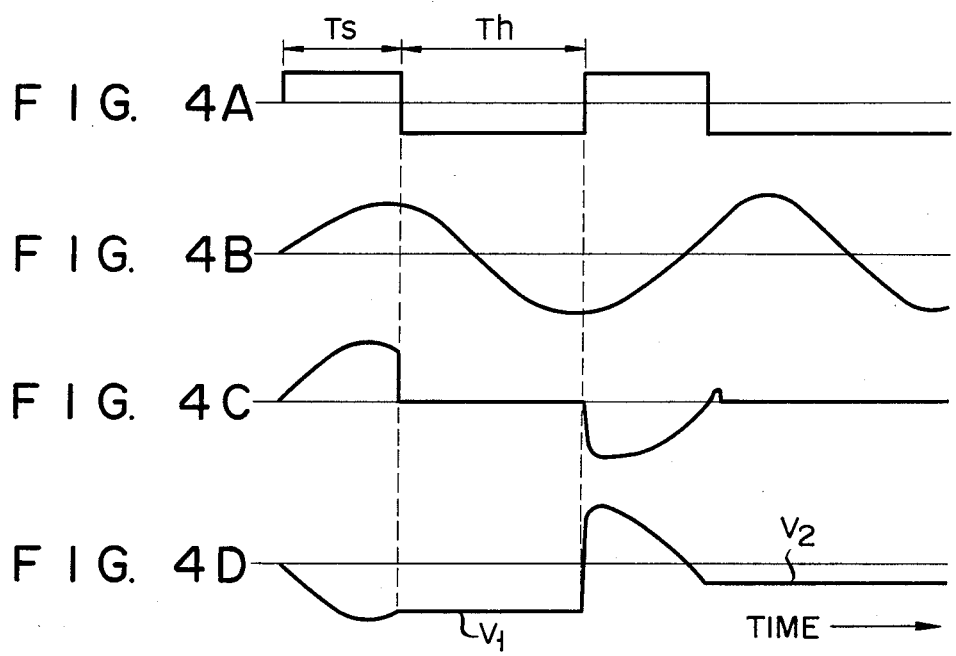
FIG. 4A
FIG. 4B
FIG. 4C
FIG. 4D

SAMPLING CIRCUIT

BACKGROUND OF THE INVENTION

The present invention relates to a sampling circuit generally used as part of a sample-and-hold circuit so as to sample an analog input signal and generate sampling signals in response to a control signal at a series of definite points in time.

Sample-and-hold circuits are known as analog storage devices which permit readout and/or storage of the value $x(t_1)$ of a variable analog signal $x(t)$ at a specified sampling time $t_1$, and they have been steadily increasing in importance.

The sample-and-hold circuit generally includes a metal oxide semiconductor (MOS) transistor which serves as an analog switch connected between a buffer amplifier and an operational amplifier. A voltage level of the analog input signal is sampled at a specified sampling time by the switching operation of the MOS transistor in response to an externally supplied control signal. The MOS transistor is rendered nonconductive during a holding interval so as to electrically separate the sampling circuit from the input stage of the operational amplifier. Therefore, the sampled voltage is held by a capacitor connected in parallel with the operational amplifier.

However, in the circuit arrangement described above, the MOS transistor has poor linearity in its current-voltage characteristic curve while it is rendered conductive, and the linearity of the sampling circuit is degraded accordingly. When the frequency of the input signal is increased, a noise component such as distortion or a nonlinear term is superposed on the output signal at the sampling time, thereby degrading the frequency characteristics of the sampling circuit, resulting in a pronounced drawback.

SUMMARY OF THE INVENTION

It is an object of the present invention to provide a new and improved sampling circuit which has good dynamic characteristics and which is generally suitable for a sample-and-hold circuit.

The sampling circuit according to the present invention receives an electrical input signal at its input terminal. The input signal has a waveform which changes in an analog manner. The sampling circuit generates a sampling signal at its output terminal in a first mode. The output signal has a waveform substantially equivalent to that of the input signal. However, in a second mode, the sampling circuit electrically separates the input terminal from the output terminal thereof, thereby stopping the input signal. The sampling circuit comprises first and second differential amplifiers. The first differential amplifier has inverting and noninverting inputs each connected to the output and input terminals of the sampling circuit. The second differential amplifier has an inverting input to which an output signal therefrom is negatively fed-back and a noninverting input to which a preselected reference voltage is supplied. A switching transistor is connected to the outputs of the first and second differential amplifiers and the output terminal of the sampling circuit. A control circuit is provided in the sampling circuit to selectively and alternatively supply operating power to one of the first and second differential amplifiers in accordance with the change between first and second modes. Thus, the first differential amplifier becomes operative in the first mode, while the second differential amplifier becomes operative in the second mode. The transistor carries out a switching operation in response to the differential amplifiers so as to perform the sampling operation of the input signal in the first mode.

BRIEF DESCRIPTION OF THE DRAWINGS

The present invention is best understood by reference to the accompanying drawings, in which:

FIG. 3 is a diagram showing a principal circuit arrangement of a sampling circuit in accordance with the present invention;

FIGS. 4A to 4D are timing charts of signals generated from the main part of the circuit configuration including the sampling circuit shown in FIG. 3;

DETAILED DESCRIPTION OF THE PREFERRED EMBODIMENT

Figure 1:
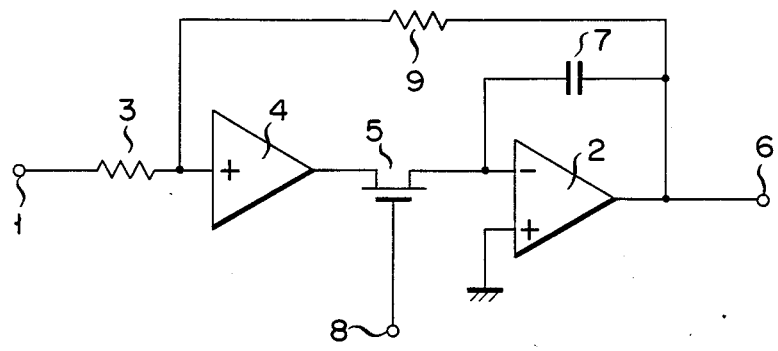
FIG. 1 is a circuit diagram showing a basic circuit configuration of a sample-and-hold circuit.

Before an embodiment of the present invention is described, a conventional sampling circuit will be described so as to best understand the present invention. FIG. 1 is a schematic diagram of a basic sample-and-hold circuit comprising a conventional sampling circuit. The conventional sampling circuit has a metal oxide semiconductor (MOS) transistor as an analog switching device. In the conventional sample-and-hold circuit shown in FIG. 1, an input terminal 1 which receives an analog signal is connected to an inverting input terminal of an operational amplifier 2 through a gain regulating resistor 3, a buffer amplifier 4 and an MOS field effect transistor 5. The operational amplifier 2 has a noninverting input terminal which is grounded and an output terminal which is connected to a signal output terminal 6. A voltage holding capacitor 7 is connected between the inverting input terminal and the output terminal of the operational amplifier 2. The gate electrode of the MOSFET 5 is connected to a control signal input terminal 8 and performs switching operations in response to a digital control signal. Reference numeral 9 denotes a gain regulating resistor connected between the input terminal of the buffer amplifier 4 and the output terminal of the operational amplifier 2.

The MOSFET 5 is rendered conductive in response to a control signal which is set at a logical high level during the sampling time, thereby supplying the analog input signal to the inverting input terminal of the operational amplifier 2 through the MOSFET 5. The analog voltage signal is inverted by the operational amplifier 2 and is transferred to the output terminal 6. Thus, the analog voltage signal appears at the output terminal 6. A voltage substantially equal to that of the output signal is applied across the two ends of the capacitor 7. Thereafter, when the control signal goes to a low level and the holding interval is initiated, the MOSFET 5 is rendered nonconductive, thereby electrically separating the operational amplifier 2 from the buffer amplifier 4.

In other words, the input stage of the operational amplifier 2 is disconnected from the sampling circuit. As a result, the voltage applied across the two ends of the capacitor 7 appears at the output terminal 6, so that the voltage sampled during the sampling time is substantially held during the holding interval.

As described above, when the MOSFET 5 is used as the analog switch, a sampling circuit can be readily obtained. However, the conventional sampling circuit of this type has the following drawbacks.

Figure 2:
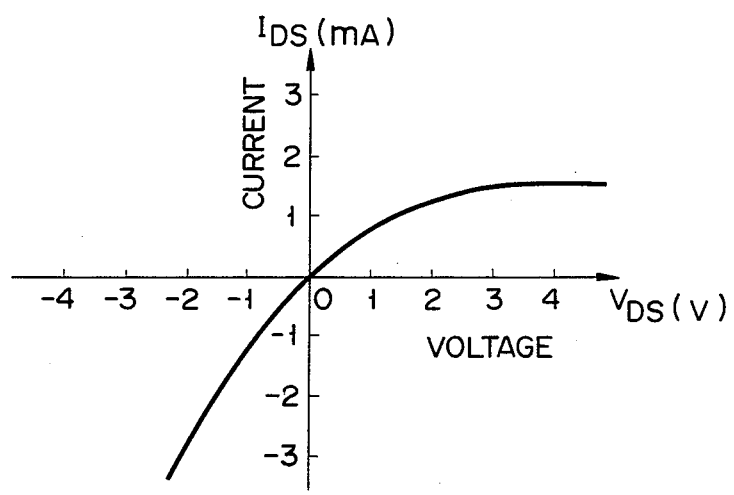
FIG. 2 is a graph illustrating the voltage-current characteristic curve of the sample-and-hold circuit shown in FIG. 1.

First, although the MOS transistor can be readily rendered conductive, the linearity of its voltage-current characteristics is poor, thereby degrading the linearity of the sampling circuit. FIG. 2 is a graph for explaining drain current $I_{DS}$ vs drain voltage $V_{DS}$ characteristics when the gate-source voltage is held constant. Nonlinearity results in an output distortion during the sampling time. This distortion increases as the frequency of the input signal is increased, resulting in a decisive drawback of the sampling circuit.

Second, since the sampling circuit includes the MOSFET 5, the sampling circuit cannot be conveniently formed in an integrated circuit. In particular, it is very difficult to form a bipolar transistor and an MOS transistor on a single IC. If they are to be formed on a single IC, a complex manufacturing process is required, resulting in high cost.

FIG. 3 shows the basic configuration of a sampling circuit according to the present invention. Referring to FIG. 3, a first differential amplifier 10 is connected at the noninverting input terminal thereof to an input terminal 12 to which an analog voltage signal is supplied, and is also connected at its inverting input terminal to an output terminal 14 from which a sampled voltage signal is generated. The first differential amplifier 10 has its output terminal connected to a first input terminal of an adding circuit or adder 16. A second differential amplifier 18 is provided such that its noninverting input terminal is supplied with a constant DC voltage or grounded, for example, and its output terminal is connected to a second input terminal of the adder 16. The adder 16 adds the output voltage signals from the differential amplifiers 10 and 18 and generates a sum signal from its output terminal. The sum signal is then supplied to the base of a bipolar transistor 20 such as an npn transistor and to the inverting input terminal of the second differential amplifier 18. The base of the bipolar transistor 20 is connected to both the output terminal of the adder 16 and the inverting input terminal of the second differential amplifier 18. The transistor 20 has a collector connected to a first power terminal 22, to which a first power source voltage $V_{CC}$ is supplied, and has an emitter connected to the output terminal 14.

A first current switch 24 comprising a double-throw switch is provided to alternately operate the first and second differential amplifiers 10 and 18. The switch 24 is connected, through a current source 28, at its common terminal to a second power terminal 26 to receive a second power source voltage $V_{ee}$ lower than the first voltage $V_{CC}$. The switching operation of the switch 24 causes the current source 28 to be selectively connected to the first differential amplifier 10 or the second differential amplifier 18. Either amplifier 10 or 18 may be rendered operative when the operating current flows from the current source 28 through the switch 24. For example, the switch 24 may be switched to the state A as indicated by the solid line in FIG. 3, so that the current flows from the current source 28 to the second differential amplifier 18. As a result, the second amplifier 18 is held operative. However, the first differential amplifier 10 which is disconnected from the switch 24 is then rendered nonoperative.

A common node 30 between the inverting input terminal of the first differential amplifier 10, the output terminal 14 and the emitter of the transistor 20 is connected through a second switch 32 to another current source 34 which is further connected to the second power terminal 26.

The operation mode of this sampling circuit in accordance with the present invention will now be described. The externally supplied digital control signal goes to, for example, logical high level during a sampling time or period Ts, as shown in FIG. 4A. In response to this high level digital control signal, the first switch 24 is switched by a known switch driver (not shown) to a state B as indicated by the broken line in FIG. 3, and the second switch 32 is turned on. The operating current from the current source 28 is supplied only to the first differential amplifier 10, so that the first differential amplifier 10 is held operative. At the same time, the output-stage bipolar transistor 20 is supplied with a current from the current source 34 through the switch 32 to be rendered conductive. Under this condition, the second differential amplifier 18 is rendered nonoperative, while a negative feed-back loop $L_1$ is formed by the operative first amplifier 10, the adder 16 and the conductive bipolar transistor 20. The output signal from the first amplifier 10 is fed-back to the inverting input thereof through the adder 16 and the base-emitter path of the bipolar transistor 20. As a result, a voltage at the noninverting input terminal of the first differential amplifier 10 becomes equal to that at the inverting input terminal thereof, and hence the absolute value of a voltage at the input terminal 12 of the sampling circuit becomes equal to that at the output terminal 14. Meanwhile, the second switch 32 is closed, as described above, so that the current signal which changes in accordance with an analog change in the input signal (FIG. 4B) from the input terminal 12 is supplied (in fact, inverted and supplied) by the transistor 20 and the current source 34 to a hold circuit (not shown) which is connected to the output terminal 14. A change in input signal is transferred to the output terminal 14 during the sampling period Ts, thereby performing the sampling action.

During the above-noted sampling period Ts, an output impedance at the output terminal 14 is greatly decreased by the negative feed-back loop $L_1$. The sampling circuit according to the present invention is free from adverse effects caused by poor linearity or nonlinearity of the voltage-current characteristics of the MOSFET 5 of the prior-art sampling circuit described with reference to FIGS. 1 and 2. As a result, good linearity of the voltage-current characteristics can be provided. In particular, in the sampling circuit shown in FIG. 3, the base-emitter voltage $V_{BE}$ of the output-stage bipolar transistor 20 is kept constant irrespective of an output current generated at the output terminal 14. Therefore, no waveform distortion due to nonlinearity of the voltage-current characteristics will occur.

During the nonsampling interval or holding interval Th in which the control signal of the sampling circuit of FIG. 3 is inverted to a logical low level, the connection states of the first and second switches 24 and 32 are changed. The first switch 24 is switched to a connecting state A as indicated by the solid line in FIG. 3, thereby disconnecting the first amplifier 10 from the current source 28 and connecting the second amplifier 18 to the current source 28. The second switch 32 is opened so as to stop the supply of current from the current source 34. Under this condition, the negative feed-back loop $L_1$ disappears, and another negative feed-back loop $L_2$ is formed by the second differential amplifier 18 and the adder 16. An output voltage at the adder 16 (i.e., the voltage at the inverting input terminal of the second differential amplifier 18) becomes equal to the voltage (ground potential=0 V, in this embodiment) at the noninverting input terminal of the second differential amplifier 18, while the first differential amplifier 10 is rendered nonoperative. The base potential of the output-stage bipolar transistor 20 becomes 0 V, so that the base-emitter voltage thereof becomes 0 V.

The output terminal 14 is electrically separated or insulated by the second switch 32 (which is kept OFF) from the current source 34. Neither the transistor 20 nor the current source 34 supplies a current to the output terminal 14. As described above, the first differential amplifier 10 is kept nonoperative and does not produce a current therefrom. For these reasons, even if the output terminal 14 is always connected to the inverting input terminal of the first differential amplifier 10, electrical separation between the input and output terminals 12 and 14 can be properly assured. No current flows into the output terminal 14 of the sampling circuit in the nonsampling mode (i.e., holding mode), so that the input terminal 12 is completely disconnected from the output terminal 14.

The above operation is repeatedly carried out, so that the analog input signal of FIG. 4B is sampled to obtain a sampled signal shown in FIG. 4C, whereby a desired voltage level $V_1$ and $V_2$ of the analog input voltage waveform shown in FIG. 4B can be inverted and held, as shown in FIG. 4D, by a holding circuit provided at the post stage of the sampling circuit.

As described above, the sampling circuit of the present invention comprises only bipolar transistors without using MOS transistors and may, therefore, be suitably arranged in an IC. Furthermore, since the negative feed-back loop $L_1$ is formed during the sampling period so as to greatly decrease the output impedance, the distortion caused by nonlinearity of the voltage-current characteristics of the output-stage transistor is decreased. As a result, the linearity of the sampling circuit is greatly improved. Even though a bipolar transistor is used as the output-stage transistor, the input terminal is completely separated from the output terminal during the nonsampling period in the same manner as in an MOS transistor, and the control signal cannot leak to the output terminal. When the sampling circuit of the present invention is used in a sample-and-hold circuit, the holding action of the holding circuit will not be degraded.

Figure 5:
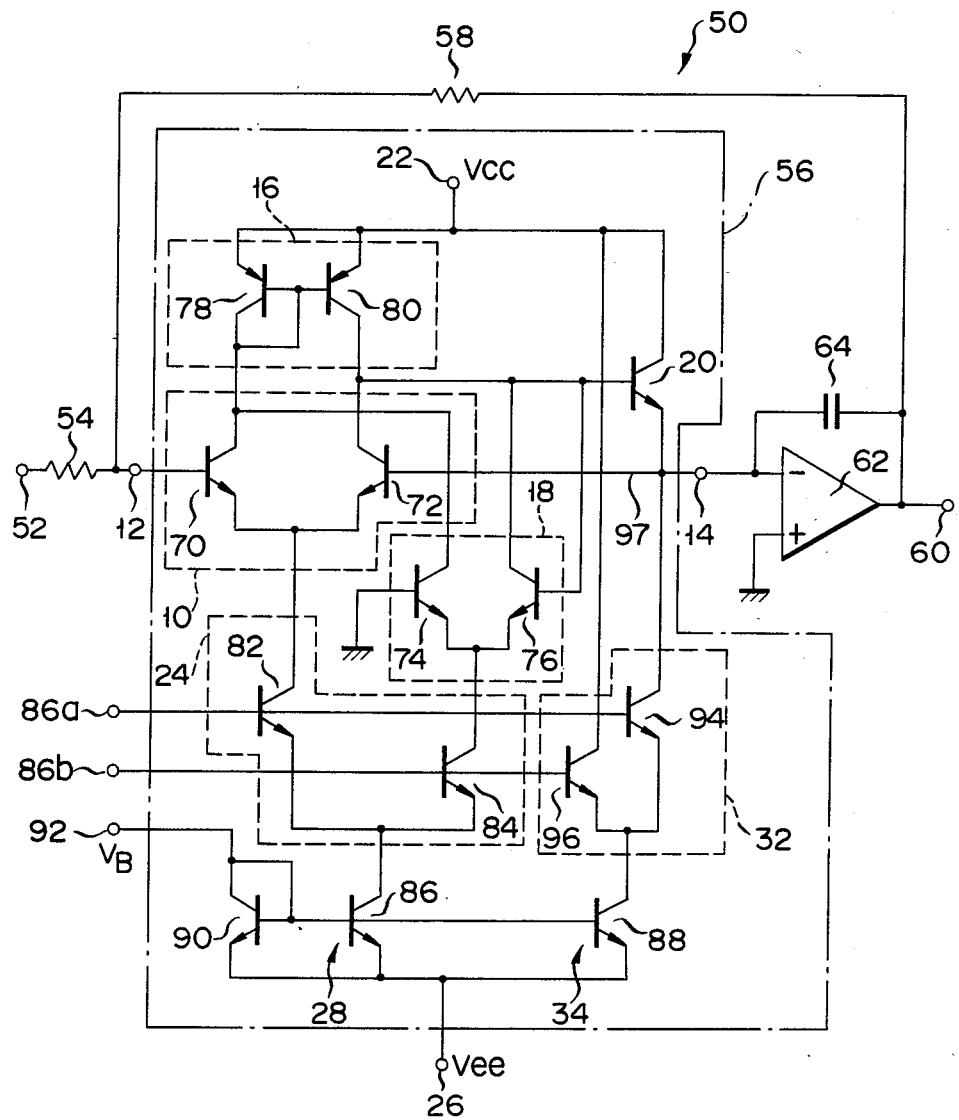
FIG. 5 is a circuit diagram showing the overall arrangement of a sample-and-hold circuit including a detailed example of the sampling circuit shown in FIG. 3.

FIG. 5 is a circuit diagram of a sample-and-hold circuit 50 which includes a sampling circuit such as that shown in FIG. 3. In the sample-and-hold circuit (to be referred to as an S/H circuit for brevity hereinafter) 50, the same reference numerals as used in FIG. 3 denote the same parts in FIG. 5, and a detailed description thereof will be omitted.

Referring to FIG. 5, an input terminal 52 of the S/H circuit 50 is connected to the input terminal 12 of a sampling circuit 56 through a gain regulating resistor 54, and to an output terminal 60 of the S/H circuit 50 through another gain regulating resistor 58. The output terminal 14 of the sampling circuit 56 is connected to an inverting input terminal of a buffer amplifier 62 included in the holding circuit. The buffer amplifier 62 has a grounded noninverting input terminal. A holding capacitor 64 is connected between the inverting input terminal and an output terminal of the buffer amplifier 62.

In the sampling circuit 56, the first differential amplifier 10 includes two npn transistors 70 and 72 the emitters of which are commonly connected to each other. The second differential amplifier 18 also includes two npn transistors 74 and 76 the emitters of which are similarly connected to each other. The base of the transistor 74 is grounded. The adder 16 is formed by two pnp transistors 78 and 80 constituting a current mirror circuit. This current mirror circuit serves as a common load of the first and second differential amplifiers 10 and 18. The bases of the transistors 78 and 80 are connected to each other, their emitters are connected to the first power terminal 22, and their collectors are respectively connected to the collectors of the transistors 70 and 74 on the one hand and to those of transistors 72 and 76 on the other. Since the collector of the output-stage transistor 80 of the current mirror circuit produces a sum of output currents (i.e., the collector currents from the transistors 72 and 76) of the first and second differential amplifiers 10 and 18, the current mirror circuit serves as the adder 16 described above.

The first switch 24 is formed by a pair of npn switching transistors 82 and 84 whose bases are respectively connected to control signal input terminals 86a and 86b, emitters are connected to each other, and collectors are respectively connected to the emitters of the transistors 70 and 72 of the first differential amplifier 10 and to those of transistors 74 and 76 of the second amplifier 18. Current sources 28 and 34 are formed by npn transistors 86 and 88, respectively. The bases of the npn transistors 86 and 88 are commonly connected to each other and their emitters are connected to the second power terminal 26. The collector of the transistor 86 is connected to the emitters of transistors 82 and 84. The transistors 86 and 88 receive as a bias current an output voltage from an npn transistor 90 diode-connected to a third power terminal 92 to which a power source voltage $V_B$ is supplied, and serve as constant current sources, respectively.

The second switch 32 includes two npn transistors 94 and 96 whose bases are respectively connected to the control signal input terminals 86a and 86b and whose emitters are commonly connected together to the collector of the transistor 88. One transistor 94 of the second switch 32 is connected at its collector to a line 97 which connects the base of the transistor 72 to the sampling output terminal 14 and which is connected through the output-stage transistor 20 to the first power terminal 22. The collector of the other transistor 96 is directly connected to this terminal 22. The base of the output-stage transistor 20 is connected to the base and collector of the transistor 76 included in the second differential amplifier 18.

The operation of the S/H circuit 50 having the above arrangement will now be described hereinafter. The potential at the terminal 86a is higher than that at the terminal 86b during the sampling time Ts (FIG. 4A) since the control signal is supplied to the terminal 86a. Therefore, the transistors 82 and 94 are rendered conductive, while the transistors 84 and 96 are nonconductive, whereby the first differential amplifier 10 and the output-stage transistor 20 become operative and the second differential amplifier 16 becomes nonoperative. A change in the analog input signal level (FIG. 4B) at the sampling input terminal 12 is transferred to the sampling output terminal 14 through the first differential amplifier 10, the adder 16 and the conductive transistor 20. The change in potential of the analog input signal (FIG. 4B) supplied to the sampling input terminal 12 appears at the output terminal 14. A local negative feed-back loop is formed by the transistors 70, 72, 78, 80 and 20 of the sampling circuit 56. The output impedance at the sampling output terminal 14 is kept sufficiently low to permit good signal transmission.

The control signal is supplied to the terminals 86a and 86b during the holding period Th (FIG. 4A) such that the relationship between the potentials at these terminals is the reverse of that during the sampling period. More specifically, the potential at the terminal 86b becomes higher than that of the terminal 86a. In accordance with this potential relationship, the transistors 82 and 94 are rendered nonconductive, while the transistors 84 and 96 are rendered conductive, so that the first differential amplifier 10 becomes nonoperative and the second differential amplifier 16 becomes operative. As a result, the base potential of the output-stage transistor 20 is controlled to be ground voltage (i.e., 0 V), so that the transistor 20 is rendered nonconductive. Similarly, the base current of the transistor 72 becomes zero, and the transistor 94 is held in the nonconductive state. The sampling circuit is equivalently kept in the open state with respect to the sampling output terminal 14. An output voltage of the S/H circuit 50 is held at the level at the end of the sampling time Ts (e.g., $V_1$ in FIG. 4D) during the holding period Th.

According to the above embodiment, the circuit elements substantially comprise npn transistors, so that the S/H circuit as a whole can be operated at a high speed. This is because the npn transistor is known to have frequency characteristics and other characteristics which are better than those of the pnp transistor.

Figure 6:
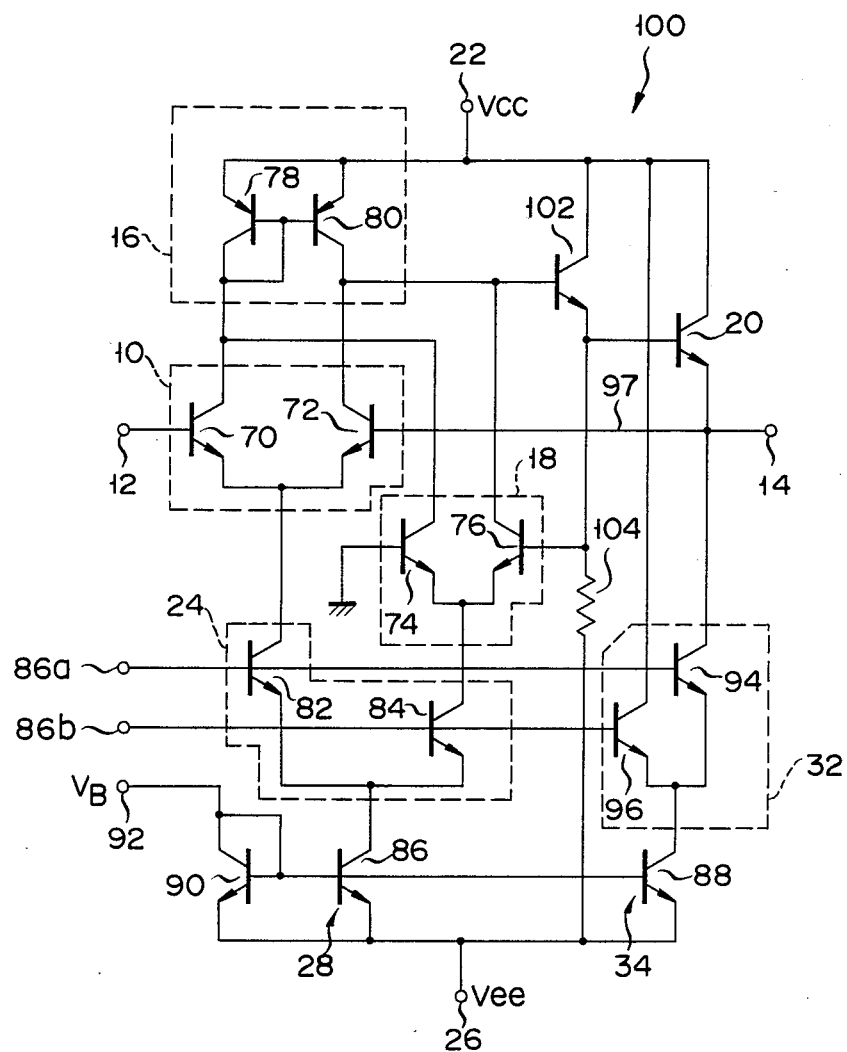
FIGS. 6 to 8 are circuit diagrams showing respective modifications of the sampling circuit shown in FIG. 5.
Figure 7:
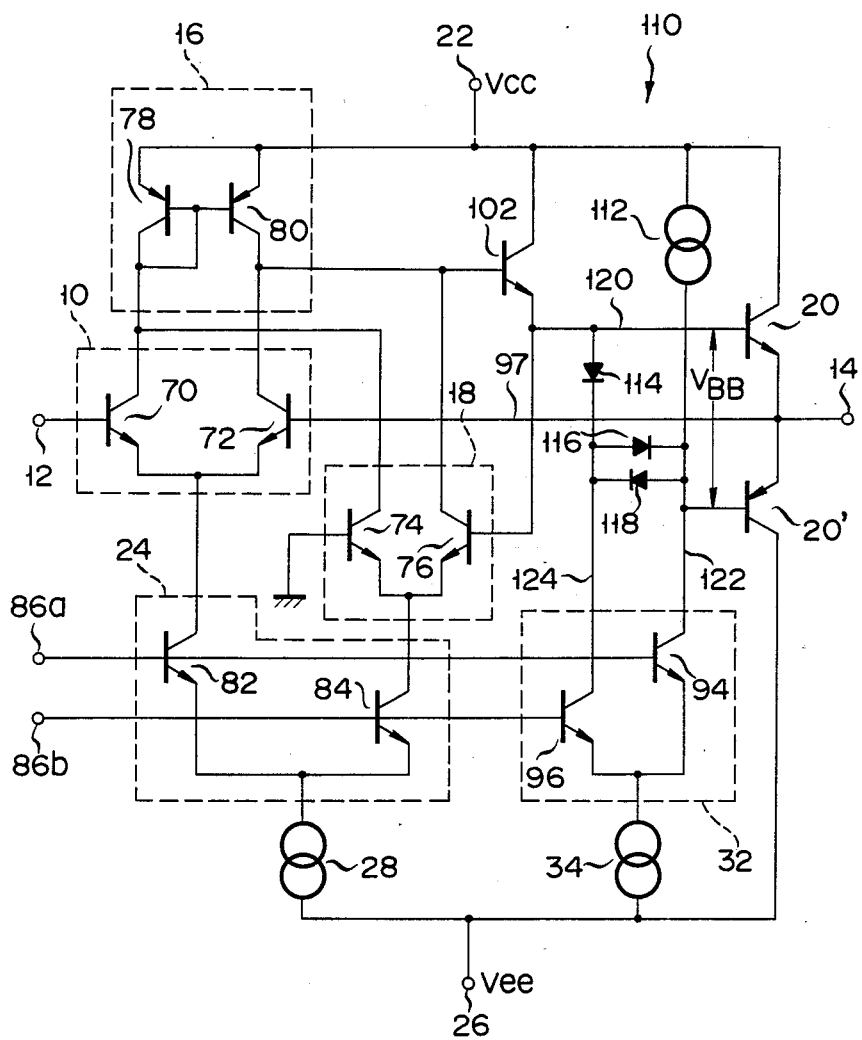
Figure 8:
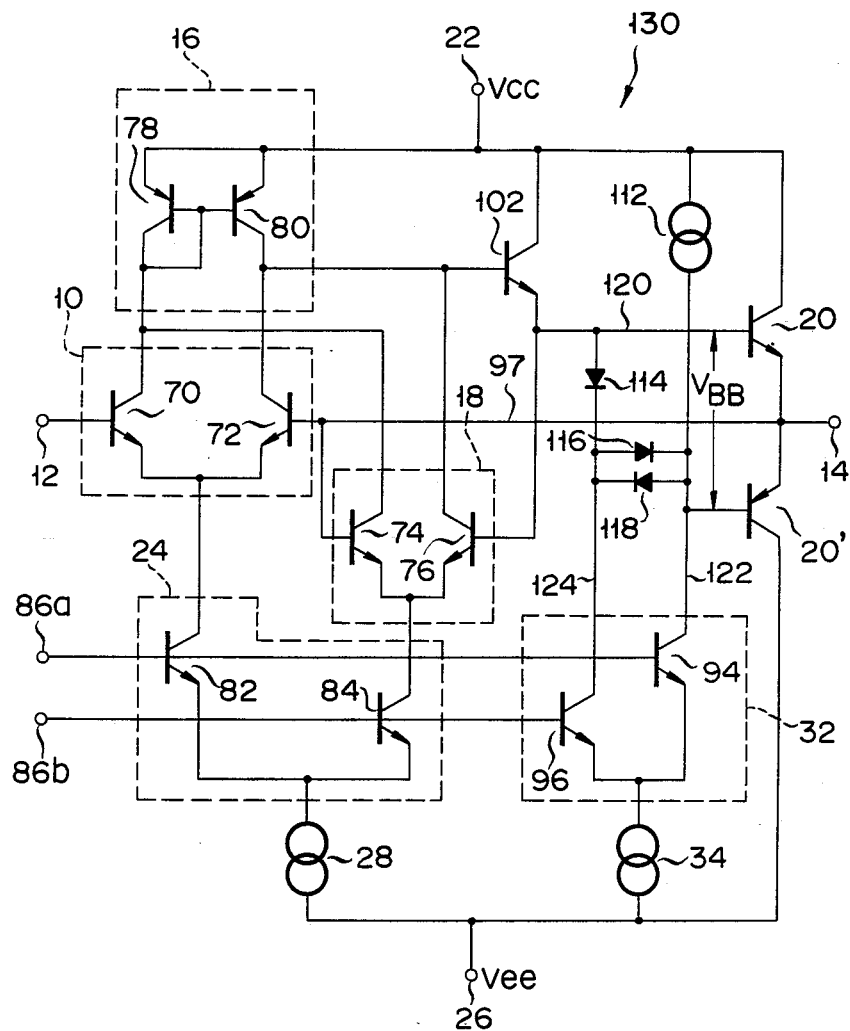

Modifications of the sampling circuit 56 used in the S/H circuit (FIG. 5) are illustrated in FIGS. 6 to 8, respectively. In a sampling circuit 100 of the modification shown in FIG. 6, an emitter-follower which has a transistor 102 and a resistor 104 is added to the output stage of the adder 16. The load of the adder 16 is decreased, thereby stably operating the sampling circuit.

In a sampling circuit 110 in accordance with another modification in FIG. 7, a pnp transistor 20' is complementarily connected in series with the npn transistor 20. The pnp transistor 20' has its emitter connected to the sampling output terminal 14 and its collector connected to the second power terminal 26. The sampling output stage of these complementary bipolar transistors 20 and 20' allows further improvement in the linearity of the voltage-current characteristics of the sampling circuit as part of the circuit configuration of the present invention. In this case, a third current source 112 and diodes 114, 116 and 118 are added to control the output-stage transistors 20 and 20', in addition to the current switch (second switch) 32 and the current source 34. More specifically, the collector of the transistor 94 in the switch 32 is connected to the first power terminal 22 through the third current source 112 and is also connected to the base of the output-stage transistor 20'. The collector of the transistor 96 in the switch 32 is connected through the cathode and anode of the diode 114 to a line 120 which connects the emitter of the transistor 102 of the emitter follower to the base of the output-stage transistor 20. The diodes 116 and 118 which are reverse-biased with respect to each other are provided between a line 122 connected to the collector of the transistor 94 and a line 124 connected to the collector of the transistor 96.

According to the circuit arrangement described above, when the transistor 94 included in the current switch 32 is rendered conductive during the sampling time Ts, the voltage $V_{BB}$ across the bases of the output-stage transistors 20 and 20' becomes equal to a sum of the forward-biased voltages of the diodes 114 and 116. Therefore, both the output-stage transistors 20 and 20' are rendered conductive. The positive current component of the current flowing in the sampling output terminal 14 flows through the transistor 20, and the negative current component thereof flows through the transistor 20'. As a result, the forward- and reverse-biased current components are guaranteed to be symmetrical.

Thereafter, during the nonsampling period or holding period Th, when the transistor 94 of the current switch 32 is rendered nonconductive and the transistor 96 therein is rendered conductive, the base-base voltage $V_{BB}$ of the output-stage transistors 20 and 20' becomes 0 V since the current from the third current source 112 flows through the diode 118 and the conductive transistor 96. In this condition, the base potential of the output-stage transistor 20' becomes 0 V in addition to the base potential of the output-stage transistor 20 becoming 0 V. Therefore, both the output-stage transistors 20 and 20' are rendered nonconductive, whereby the sampling output terminal 14 is equivalently held in an open state (i.e., a sampling-off state).

According to a sampling circuit 130 shown in FIG. 8, the base of one of the transistors included in the second differential amplifier 18 is not grounded but is connected to the line 96 which connects the base of the transistor 72 of the first differential amplifier 10 to the sampling output terminal 14. In the sampling circuit having the circuit arrangement described above, the base-emitter voltage of each of the output-stage transistors 20 and 20' can be freely controlled except for that period when the sampling output terminal is grounded (i.e., 0 V). In other words, the sampling and non-sampling modes can be properly switched irrespective of the output potential at the sampling output terminal 14. Therefore, the sampling circuit 130 shown in FIG. 8 can be applied to any circuit which performs sampling operations, as well as to the S/H circuit. Even if any circuit other than the holding circuit is connected to an output stage of the sampling circuit 110 shown in FIG. 8, the circuit 110 can properly perform sampling operations. Therefore, the load of the sampling circuit 110 can be selected from a large range.

Although the present invention has been shown and described with respect to the particular embodiments, various changes and modifications which are obvious to a person skilled in the art to which the invention pertains are deemed to lie within the spirit and scope of the invention.

What is claimed is:

1. A sampling circuit generally suitable for a sample-and-hold circuit and having an input terminal to which an electrical signal with an analog waveform is supplied and an output terminal, said sampling circuit comprising:
   (a) a first differential amplifier having a noninverting input terminal connected to said sampling circuit input terminal, an inverting input terminal connected to said sampling circuit output terminal, and an output;
(b) a second differential amplifier having a noninverting input to which a predetermined reference voltage is supplied, an inverting input, and an output;
(c) adder means for adding output signals from said first and second differential amplifiers to generate a sum signal at an output thereof connected to the inverting input of said second differential amplifier;
(d) a transistor having a base connected to the output of said adder means, an emitter connected to the inverting input of said first differential amplifier and to said output terminal of said sampling circuit, and a collector to which a power source voltage is supplied; and
(e) controlling means, connected to said first and second differential amplifiers, for selectively supplying operating power to one of said first and second differential amplifiers, thereby selectively and alternately setting said first and second differential amplifiers in an operative state.

2. The circuit according to claim 1, wherein said controlling means causes said first differential amplifier to be operative during a first period corresponding to a sampling time and said second differential amplifier to be operative during a second period excluding the first period.

3. The circuit according to claim 2, further comprising:
means for supplying a predetermined current to said output terminal of said sampling circuit during the first period and for stopping supply of the current during the second period.

4. The circuit according to claim 3, wherein said transistor includes a bipolar transistor of a preselected conductivity type.

5. The circuit according to claim 2, further comprising:
a second transistor of the same conductivity type as that of said first transistor, which is provided at a post stage of said adder means to have a base connected to said output of said adder means, an emitter connected to the base of said first transistor, and a collector connected to the collector of said first transistor, said second transistor constituting an emitter follower.

6. The circuit according to claim 2, further comprising:
an additional transistor complementary to said transistor, said additional transistor having a base, an emitter connected to said output terminal of said sampling circuit, and a collector to which a second power source voltage is supplied; and
diode means, connected between the bases of said both transistors, for setting a base-base voltage of said both transistors to be substantially the same as a forward-bias voltage at said diode means, so as to cause said both transistors to become operative during the first period and said both transistors to become nonoperative during the second period.

7. The circuit according to claim 5, further comprising:
a third transistor complementary to said first transistor, said third transistor having a base, an emitter connected to said output terminal of said sampling circuit, and a collector to which a second power source voltage is supplied; and
diode means, connected between said bases of said first and third transistors, for setting a base-base voltage of said first and third transistors to be substantially the same as a forward-bias voltage at said diode means so as to cause said first and third transistors to become operative during the first period and cause said first and third transistors to become nonoperative during the second period.

* * * * *